United States Patent
Crook

(10) Patent No.: US 6,549,079 B1
(45) Date of Patent: Apr. 15, 2003

(54) FEEDBACK SYSTEMS FOR ENHANCED OSCILLATOR SWITCHING TIME

(75) Inventor: David T. Crook, Summerfield, NC (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 10/008,433

(22) Filed: Nov. 9, 2001

(51) Int. Cl.[7] ................................................ H03L 7/00
(52) U.S. Cl. ............................ 331/17; 331/14; 331/18; 331/DIG. 2
(58) Field of Search .................. 331/17, DIG. 2, 331/14, 18

(56) References Cited

U.S. PATENT DOCUMENTS

| | | | |
|---|---|---|---|
| 5,081,427 A | * | 1/1992 | Suarez ........................ 331/10 |
| 5,511,100 A | | 4/1996 | Lundberg et al. |
| 5,572,168 A | | 11/1996 | Kasturia |
| 5,656,975 A | * | 8/1997 | Imura ......................... 331/11 |
| 5,896,067 A | | 4/1999 | Williams |
| 5,942,949 A | * | 8/1999 | Wilson et al. ............... 331/17 |
| 5,956,379 A | | 9/1999 | Tarleton |
| 6,002,273 A | | 12/1999 | Humphreys |
| 6,028,460 A | | 2/2000 | McCollum |
| 6,169,638 B1 | | 1/2001 | Morling |
| 2002/0149429 A1 | * | 10/2002 | Sander ........................ 331/17 |

OTHER PUBLICATIONS

Byrd, David, et al., Application Note 1000, National Semiconductor Corporation, Jul., 1995, pp. 1–5.
Application Note 1001, National Semiconductor Corporation, Jul., 2001, pp. 1–7.

* cited by examiner

*Primary Examiner*—Robert Pascal
*Assistant Examiner*—Joseph Chang
(74) *Attorney, Agent, or Firm*—Koppel, Jacobs, Patrick & Heybl

(57) ABSTRACT

Feedback control loop systems are provided that enhance output-signal switching times without degrading other loop performance parameters. The systems reduce "kick-back" voltages that are generated in a loop filter by drive currents which rapidly drive a control loop oscillator to a loop acquisition range. This reduction reduces a frequency step in the oscillator output signal which would otherwise have to be driven to eliminate the frequency step with a consequent increase in the output-signal switching time. Structures are provided that reduce the kick-back voltage to thereby enhance output-signal switching times.

14 Claims, 7 Drawing Sheets

FEEDBACK SYSTEMS FOR ENHANCED OSCILLATOR SWITCHING TIME

BACKGROUND OF THE INVENTION

1. Field of the Invention

The present invention relates generally to feedback control systems and, more particularly, to phase-locked loops.

2. Description of the Related Art

A phase-locked loop is a particular type of feedback control system that maintains an output signal in a specific phase relationship with a reference signal. Phase-locked loops are vital parts of a wide variety of electronic systems (e.g., frequency synthesizers, analog and digital modulators, clock recovery circuits and direct digital synthesizers) and the basic structure of conventional phase-locked loops has been described (e.g., see U.S. Pat. Nos. 6,222,421 and 6,252,466 respectively issued Apr. 24, 2001 and Jun. 26, 2001).

Conflicting demands are placed on the selection of a loop bandwidth for a phase-locked loop. The loop bandwidth is preferably set low to filter out input-related spurious tones and phase noise to thereby meet required system spectral and noise performances. The loop bandwidth, however, is preferably set high to achieve fast output-signal switching time in response to a frequency change of the reference signal.

The selection of loop bandwidth has therefore typically been a compromise which degrades one or more phase-locked loop performance parameters. Accordingly, there is a need for feedback systems that enhance output-signal switching times without degrading other loop performance parameters.

SUMMARY OF THE INVENTION

The present invention is directed to feedback systems that enhance output-signal switching times without degrading other loop performance parameters (e.g., loop spectral and noise reduction).

These goals are realized with feedback control systems that include charge pump and loop filter combinations which reduce "kick-back" voltages that are generated in the loop filter by drive currents which rapidly drive a control loop oscillator to a loop acquisition range. It has been found that the kick-back voltage generates a frequency step in the oscillator output signal which must then be driven to eliminate the frequency step with a consequent increase in the output-signal switching time. The systems of the invention reduce the kick-back voltage to thereby enhance output-signal switching times.

The novel features of the invention are set forth with particularity in the appended claims. The invention will be best understood from the following description when read in conjunction with the accompanying drawings.

DETAILED DESCRIPTION OF THE INVENTION

Figure 1:
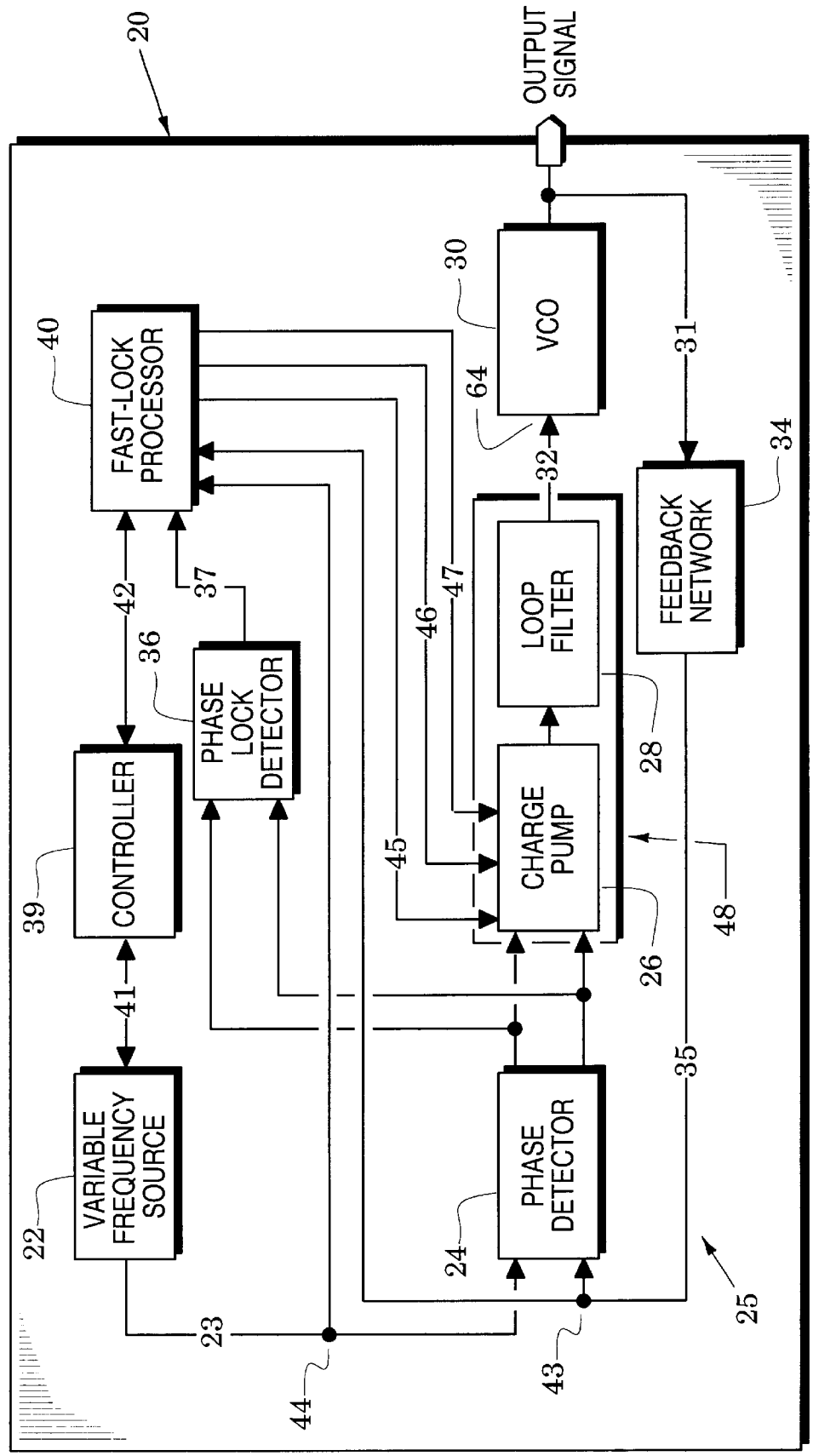
FIG. 1 is a block diagram of a feedback control system of the present invention.
Figure 2:
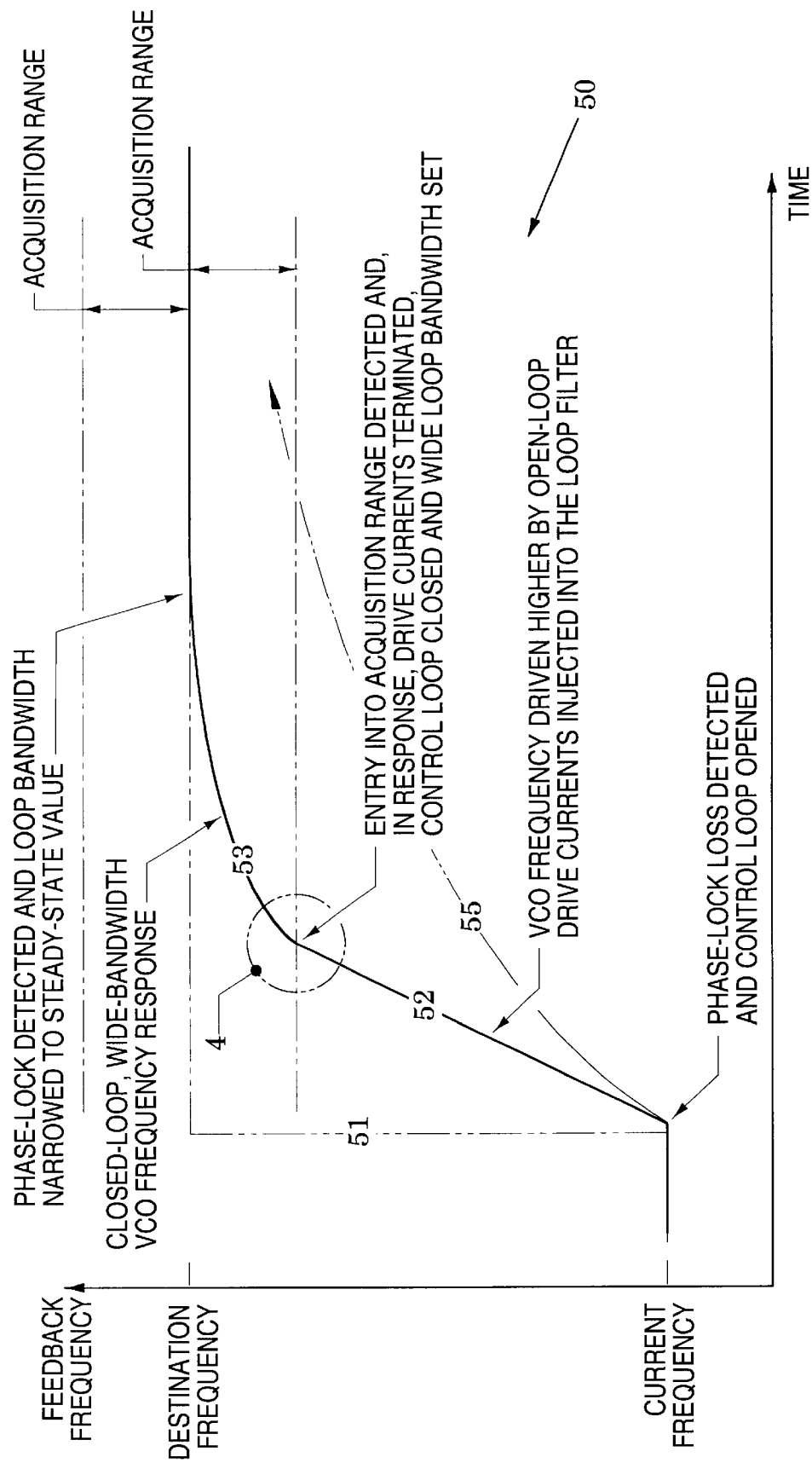
FIG. 2 is a frequency graph that illustrates process steps in the system of FIG. 1.

FIGS. 1–7 illustrate feedback system embodiments of the present invention that enhance output-signal switching times without degrading other loop performance parameters. In particular, FIG. 1 illustrates a feedback control system 20 of the invention and FIG. 2 illustrates process steps in this system when it includes the charge pump and loop filter embodiment of FIGS. 3A–3B. FIG. 4A enlarges a portion of FIG. 2 to facilitate further investigation of output-signal switching times. Other charge pump and loop filter embodiments which further enhance output-signal switching times are shown in FIGS. 5A–5B and 6A–6B and FIG. 7 illustrates a detailed realization of one of these embodiments.

Attention is initially directed to the feedback control system 20 of FIG. 1 which includes a variable-frequency source 22 (e.g., a direct digital synthesizer, a fast hopping wide-loop phase-locked loop or other fast-switching frequency source) that provides a loop reference signal 23 to a phase detector 24 of a feedback control loop 25. A charge pump 26 provides current signals to a loop filter 28 in response to signals from the phase detector. A voltage-controlled oscillator (VCO) 30 provides a system output signal 31 whose frequency corresponds to a voltage signal 32 that is delivered from the loop filter. The loop output signal may pass through a feedback network 34 (e.g., a frequency divider or a mixer) before it is delivered as a feedback signal 35 to the phase detector 24 for comparison to the loop reference signal 23.

The output signal of the phase detector corresponds to the phase difference between the loop reference signal 23 and the feedback signal 35 and the negative feedback action of the loop urges the VCO's output signal to an output frequency wherein it is phase-locked to the reference signal 23 from the variable frequency source 22. In this locked operational mode, the charge pump 26 responds to the phase detector 24 and provides currents that charge and discharge capacitive elements of the loop filter 28 as required to maintain phase lock between the VCO's feedback signal 35 and the reference signal 23.

The phase detector, charge pump, loop filter, VCO and feedback network thus form the feedback control loop 25 and their combined transfer function forms a loop transfer function which has a steady—state operational bandwidth (also referred to herein as the narrow bandwidth).

System 20 also includes a phase-lock detector 36 that provides a monitor signal 37 in response to the output signals of the phase detector 24. A controller 39 provides control signals 41 to the variable frequency source 22. Finally, a fast-lock processor 40 responds to the monitor signal 37, to control signals 42 from the controller 39 and to signals at input nodes 43 and 44 of the phase detector 24 and, in response, provides state control signals 45, 46 and 47 to the charge pump 26.

In operation of the feedback control system 20 of FIG. 1, the controller 39 commands (via control signals 41) the variable frequency source 22 to provide a current reference signal 23 with a current loop frequency and to provide subsequent reference signals with respective destination frequencies. Thus, the controller 39 also has information on the relative direction of subsequent frequency changes which it communicates (via control signals 42) to the fast-lock processor 40.

The phase detector 24 initially compares the phase of the feedback signal 35 on node 43 with the phase of the current reference signal 23 on node 44 and, in response, generates a control signal. In response to this control signal, the charge pump 26 supplies currents to the loop filter 28 to thereby provide a VCO control voltage that maintains phase lock between the VCO's output signal 31 and the current reference signal.

At a subsequent time, the controller 39 commands the variable frequency source 22 to switch its reference signal 23 from the current frequency to a destination frequency as shown by broken line 51 in the graph 50 of FIG. 2. In response, the phase detector 24 of FIG. 1 generates a phase error signal that is detected by the phase-lock detector 36 which alerts (via the monitor signal 37) the fast-lock processor 40 to the fact that the loop is no longer locked. In a method embodiment of the invention, the fast-lock processor 40 immediately takes over control of the control loop 25 and effectively "opens" the loop as indicated at the beginning of a frequency path 52 in FIG. 2. The control loop is opened via state control signal 45 in FIG. 1 and, accordingly, it ceases to respond to phase-difference signals from the phase detector 24.

Instead, the fast-lock processor 40 (knowing the direction of the required frequency change via the control signals 42) initiates (via state control signal 47) open-loop drive currents in the charge pump 26 which are applied to the loop filter 28 to rapidly drive the VCO 30 in the appropriate frequency direction. The magnitude of the drive current level is programmable (e.g., via the control signals 42).

A drive current with an appropriate direction and a programmed magnitude is thereby sent to the loop filter 28 whose compensation capacitors charge (or discharge) at a rate that is dependent on the programmed drive current amplitude and on parameter values of capacitor elements of the loop filter. In response, the frequency of the VCO 30 is rapidly driven towards the destination frequency as indicated by frequency path 52 in FIG. 2.

While these processes are occurring, the frequency being fed back from the VCO 30 to phase detector node 43 is compared in the fast-lock processor 40 to the destination frequency of the subsequent reference signal 23 at phase detector node 44. Thus, a frequency detection loop through the fast-lock processor is effectively enabled as the phase detection loop through the phase detector 24 is disabled.

The fast-lock processor 40 monitors the frequency difference between the nodes 43 and 44 and when the frequency difference is within a predetermined acquisition range (shown in FIG. 2) restores control of the feedback loop to the phase detector 24 (i.e., returns the system 20 to its closed-loop state) via the state control signal 45. The control loop 25 is thus "closed" and again responds to phase-difference signals from the phase detector 24. When the VCO 30 is within the predetermined acquisition range, the feedback control loop 25 can pull the VCO into phase lock with the subsequent reference signal and, accordingly, the fast-lock processor 40 terminates the open-loop drive currents via state control signal 47.

When the control loop 25 is initially closed via the state control signal 45, the fast-lock processor 40 preferably modifies the charge pump 26 via state control signal 46 so that its transfer function is temporarily increased relative to its steady-state transfer function. In particular, the charge pump is modified to increase its output currents, i.e., increase the gain of its transfer function. The increased gain modifies the loop transfer function to thereby temporarily increase the bandwidth of the feedback control loop 25.

The loop bandwidth is thus temporarily greater than its steady-state operational bandwidth which is generally chosen to enhance steady-state loop characteristics (e.g., rejection of spurious signals). The wider loop bandwidth substantially reduces the time for the control loop to pull the VCO 30 into final phase lock as indicated by frequency path 53 in FIG. 2. The amplitude of the increased charge pump currents during this operational state are also programmable via control signals 42 of FIG. 1.

The phase-lock detector 36 continues to monitor output signals of the phase detector 24. When phase error of these signals reduces below a predetermined threshold (that essentially indicates phase lock), the phase-lock detector 36 signals the fast-lock processor 40 (via the monitor signal 37) which, in turn, reduces the transfer function (e.g., transfer current) of the charge pump 26 (via the state control signal 46) to its steady-state value (also indicated in FIG. 2).

The above-described process causes the control loop 25 of FIG. 1 to transition from a driven open-loop state to a wide-bandwidth closed-loop state and finally, to a steady-state narrow-bandwidth closed-loop state. This adaptive loop bandwidth process enhances rapid switching of oscillator frequencies and also realizes enhanced closed-loop performance. In absence of this process, the frequency of the feedback signal 35 of FIG. 1 would slowly move towards the destination frequency as indicated by frequency path 55 in FIG. 2 (or would not reach the destination frequency at all).

In order to facilitate further description of the feedback systems of the invention, the charge pump 26 and loop filter 28 of FIG. 1 are considered as a combined unit 48 and embodiments of this combined unit are shown in FIGS. 3A–3B, 5A–5B and 6A–6B.

Figure 3B:
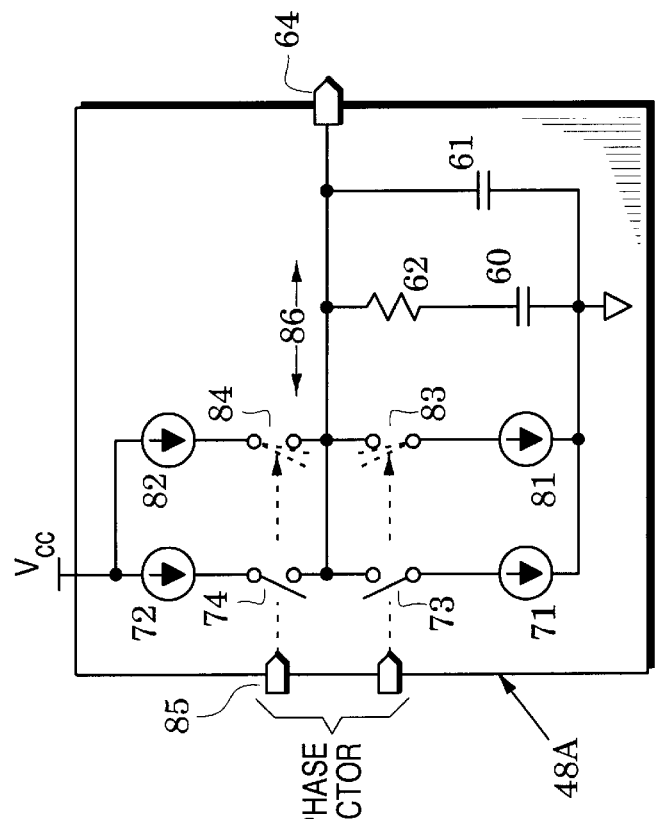
FIGS. 3A and 3B are block diagrams that respectively illustrate open-loop and closed-loop modes in a combined charge pump and loop filter embodiment for the system of FIG. 1.
Figure 3A:
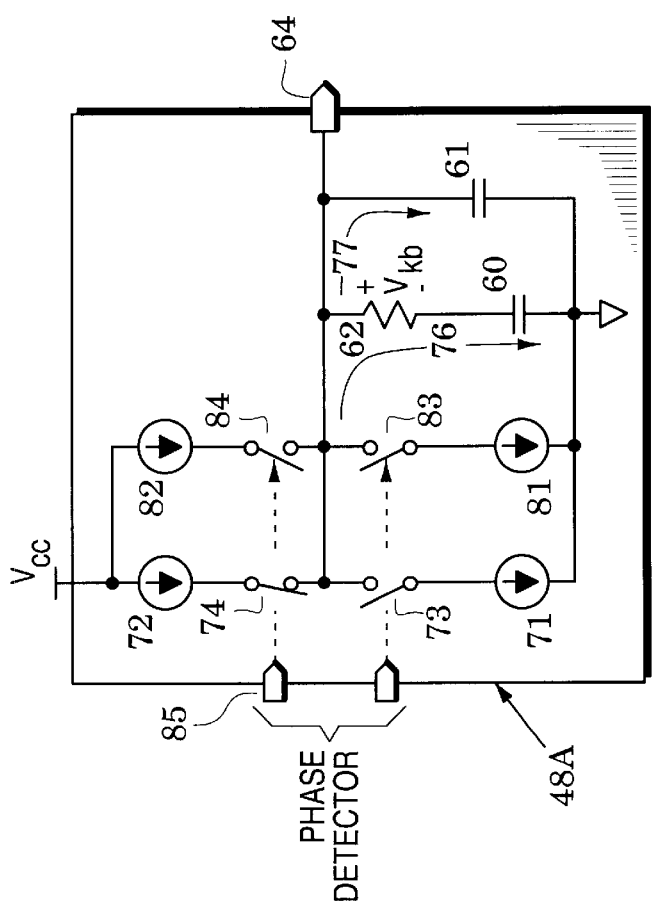

In the combined unit 48A of FIG. 3A, for example, the loop filter includes a compensation capacitor 60, a filter capacitor 61 and a compensation resistor 62. The second compensation capacitor 61 is coupled to a VCO control port 64 (also indicated in FIG. 1) and the compensation resistor couples the first compensation capacitor to the VCO control port.

The charge pump includes drive current sources 71 and 72 and respective drive switches 73 and 74 that provide open-loop drive currents (in response to state control signal 47 of FIG. 1). Drive switch 74 is shown in a closed state to supply drive currents 76 and 77 to charge the compensation and filter capacitors 60 and 62. Assuming the VCO (30 in FIG. 1) has a positive frequency response to a positively changing control voltage, these drive currents would drive the frequency of the feedback signal (35 in FIG. 1) towards the destination frequency as indicated by frequency path 52 of FIG. 2. If instead, the destination frequency were below the feedback frequency, drive switch 74 would be opened and drive switch 73 closed.

The charge pump also includes feedback current sources 81 and 82 and respective feedback switches 83 and 84 that respond to phase detector signals as indicated by broken lines from a phase detector input port 85. When the feedback control loop (25 in FIG. 1) is closed, the feedback switches 83 and 84 provide closed-loop feedback currents. In FIG. 3A, however, the feedback switches 83 and 84 are disabled (i.e., held in an open state) by the state control signal 45 of FIG. 1. With the drive switches 73 and 74 and the feedback switches 83 and 84 in the states of FIG. 3A, the frequency of the feedback signal (35 in FIG. 1) would be driven along the frequency path 52 of FIG. 2. In order to enhance output-signal switching times, the drive current sources 71 and 72 are preferably configured to supply greater currents (e.g., by a factor of 4) than the feedback current sources 81 and 82.

FIG. 3B shows the combined unit 48A after the frequency of the feedback signal (35 in FIG. 1) has reached the destination frequency shown in FIG. 2. The drive switches 73 and 74 are now disabled by the state control signal 47 of FIG. 1. The feedback switches 83 and 84 are enabled by the state control signal 45 of FIG. 1 and in response to the phase detector (24 in FIG. 1), the feedback switches are alternately opened and closed (indicated by broken-line positions) to charge and discharge the compensation and filter capacitors 60 and 61 with feedback currents 86 that keep the VCO (30 in FIG. 1) locked to the reference signal (23 in FIG. 1).

It has been found, however, that the output-signal switching times of the combined unit 48A can be improved. The compensation capacitor 60 and the compensation resistor 62 are typically chosen to place a zero in the control loop transfer function and thereby maintain a loop phase margin that provides an unconditionally-stable loop. In contrast, the filter capacitor 61 is typically selected to position (with compensation resistor 62) a higher-frequency pole in the control loop transfer function to thereby enhance filtering of spurious signals. Accordingly the capacitance of the compensation capacitor 60 is generally much greater (e.g., by an order of magnitude) than the capacitance of the filter capacitor 61 and drive current 76 is significantly greater than drive current 77 (substantially by the ratio of the capacitances).

The drive current 76 establishes a voltage $V_{kb}$ across the compensation resistor 62 that equals the product of its resistance and the drive current 76. When the control loop transitions from the open-loop condition of FIG. 3A to the closed-loop condition of FIG. 3B, the voltage $V_{kb}$ disappears because the drive current 76 ceases. The voltage $V_{kb}$ thus represents a "kick-back" voltage which must be recharged by the smaller closed-loop currents 86 of FIG. 3B if the VCO (30 in FIG. 1) is to be locked to the reference signal.

Figure 4B:
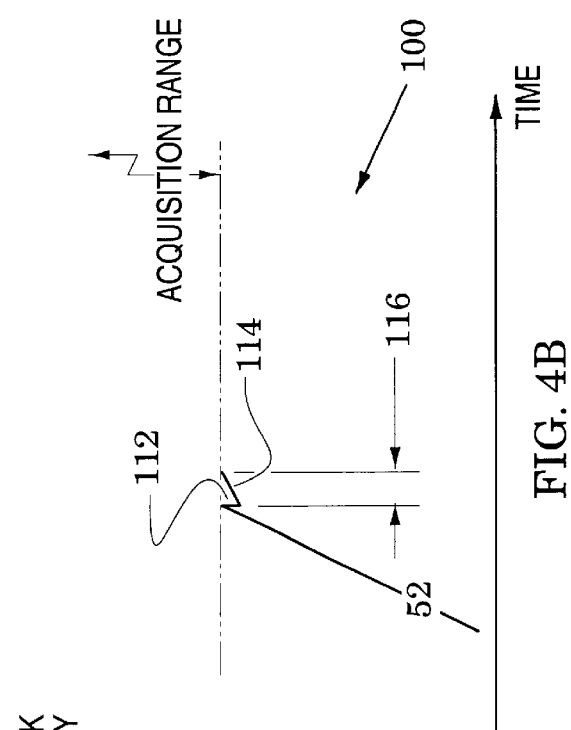
FIG. 4B is an enlargement of the region within the circle 4 of the frequency graph of FIG. 2 when the charge pump and loop filter embodiment of FIGS. 4A and 4B is used in the system of FIG. 1.
Figure 4A:
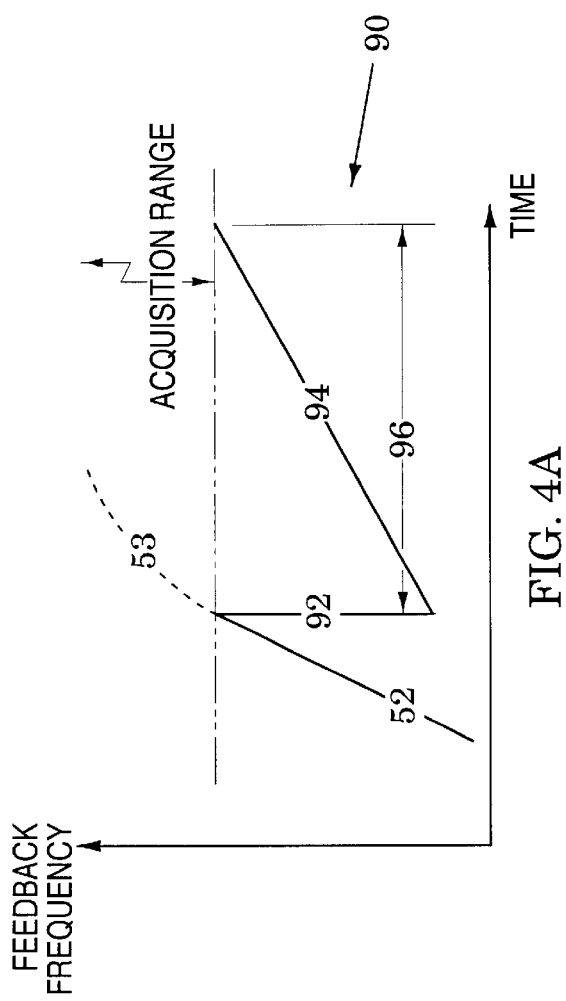
FIG. 4A is an enlargement of the region within the circle 4 of the frequency graph of FIG. 2 when the charge pump and loop filter embodiment of FIGS. 3A and 3B is used in the system of FIG. 1.

This situation is illustrated in the graph 90 of FIG. 4A which is an enlarged view of paths within the circle 4 of FIG. 2. Again, the feedback frequency follows the frequency path 52 but when it reaches the acquisition range it fails to proceed along the frequency path 53 (shown as a broken line and also shown in FIG. 2). Instead, it suffers a kick-back step 92 because of the VCO's response to the kick-back voltage $V_{kb}$ that occurs when the control loop transitions from the open-loop condition of FIG. 3A to the closed-loop condition of FIG. 3B. Subsequently, the lesser feedback currents (86 in FIG. 3B) drive the feedback frequency back to the acquisition range (and beyond) but along a substantially-reduced slope 94. Accordingly, the output-signal switching time is increased by a significant recharge time 96.

Figure 5A:
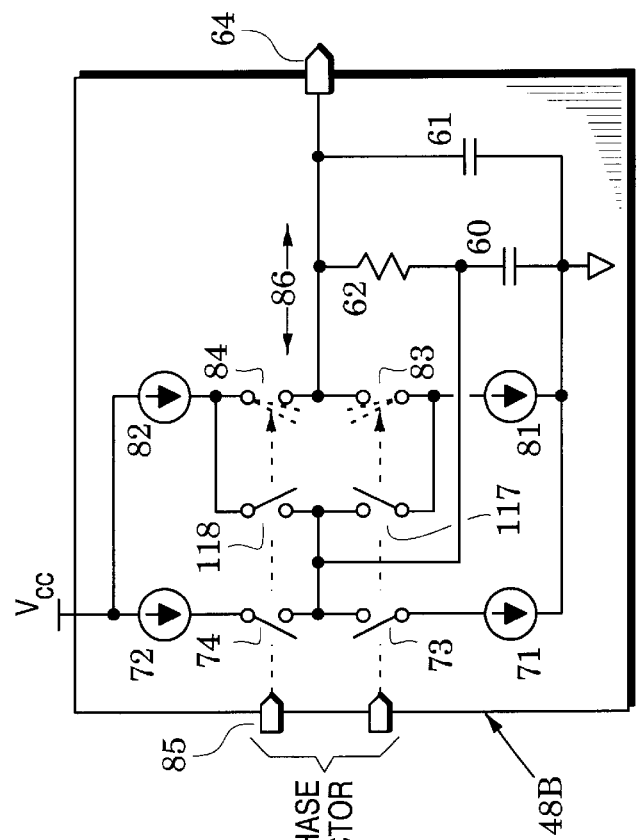
FIGS. 5A and 5B are block diagrams that respectively illustrate open-loop and closed-loop modes in another combined charge pump and loop filter embodiment for the system of FIG. 1.

FIG. 5A illustrates an improved combined unit 48B which is similar to FIG. 3A with like elements indicated by like reference numbers. In this figure, however, the drive switches 74 and 73 are coupled to the junction between the compensation resistor 62 and the compensation capacitor 60. Accordingly, a drive current 100 charges the first compensation capacitor and a significantly smaller (by approximately the ratio of the capacitances) drive current 101 flows through the compensation resistor to charge the compensation capacitor 61.

Figure 5B:
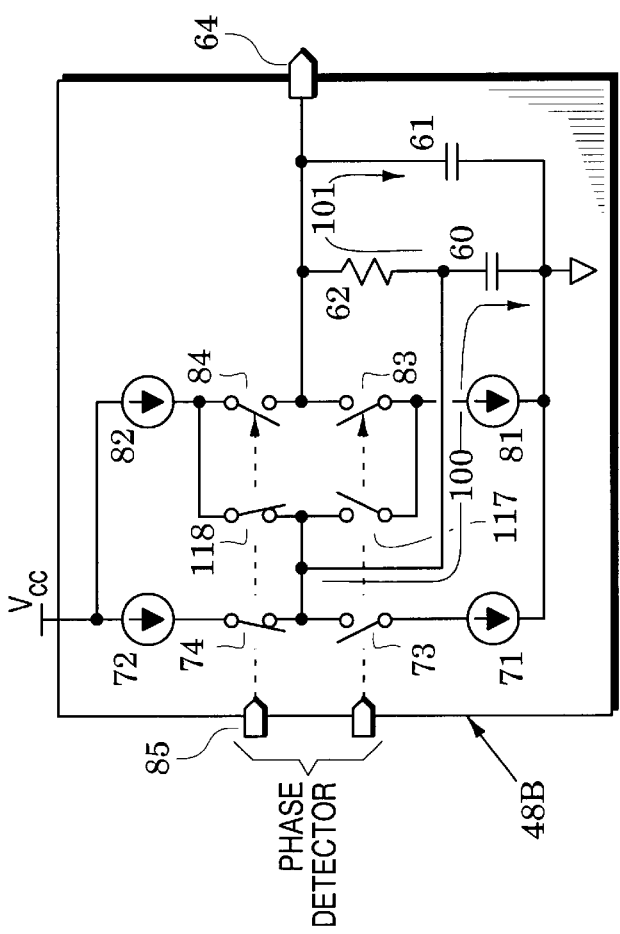

FIG. 5B shows the combined unit 48B after the frequency of the feedback signal (35 in FIG. 1) has reached the destination frequency shown in FIG. 2. The drive switches 73 and 74 are now disabled by the state control signal 47 of FIG. 1. The feedback switches 83 and 84 are enabled by the state control signal 45 of FIG. 1 and in response to the phase detector (24 in FIG. 1), the feedback switches are alternately opened and closed (indicated by broken-line positions) to charge and discharge the compensation and filter capacitors 60 and 61 with feedback currents 86 that keep the VCO (30 in FIG. 1) locked to the reference signal (23 in FIG. 1).

The drive current 101 of FIG. 5A establishes a voltage across the compensation resistor 62 that equals the product of its resistance and the drive current 101. When the control loop transitions from the open-loop condition of FIG. 3A to the closed-loop condition of FIG. 3B, this voltage disappears and must be recharged by the smaller closed-loop currents 86 as was the case in FIG. 3B. Because the drive current 101 is substantially smaller (e.g., by an order of magnitude) than the drive current 100 of FIG. 3B, however, the kick-back effect is significantly reduced (e.g., also by an order of magnitude).

This reduction is illustrated in the graph 110 of FIG. 4B. Again, the feedback frequency follows the frequency path 52 and suffers a kick-back step 112 because of the VCO's response to the disappearance of the drive voltage across the compensation resistor 62. The magnitude of the step 112, however, is reduced by at least an order of magnitude from the step 92 of FIG. 4A. Although the compensation capacitor 60 of FIG. 5B must be recharged along a substantially-reduced slope 114, the output-signal switching time is only extended by a recharge time 116 that is at least an order of magnitude less than the recharge time 96 of FIG. 4A.

The combined unit 48A of FIG. 5A also includes boost switches 117 and 118 which are respectively coupled between the feedback current sources 81 and 82 and the junction between the first compensation capacitor 60 and the compensation resistor 62. Boost switches 117 and 118 respond to the state control signal 47 of FIG. 1 just as do drive switches 73 and 74. As shown in FIG. 5A, therefore, boost switch 118 is closed because drive switch 74 is closed.

The current of the feedback current source 82 will be added to the charge current 100 (and a corresponding portion to the drive current 101). Accordingly, the slope of the frequency path 52 in FIG. 2 will be increased with a consequent further reduction of output-signal switching times. Similar to the drive switches 73 and 74, the boost switches 117 and 118 will be disabled (open) in FIG. 5B which represents the closed-loop condition.

Figure 6B:
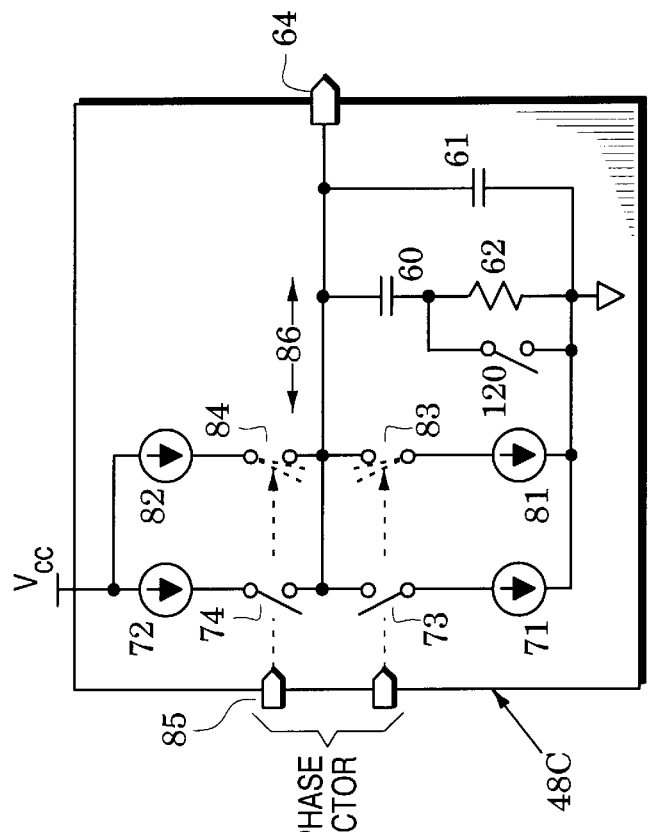
FIGS. 6A and 6B are block diagrams that respectively illustrate open-loop and closed-loop modes in another combined charge pump and loop filter embodiment for the system of FIG. 1.
Figure 6A:
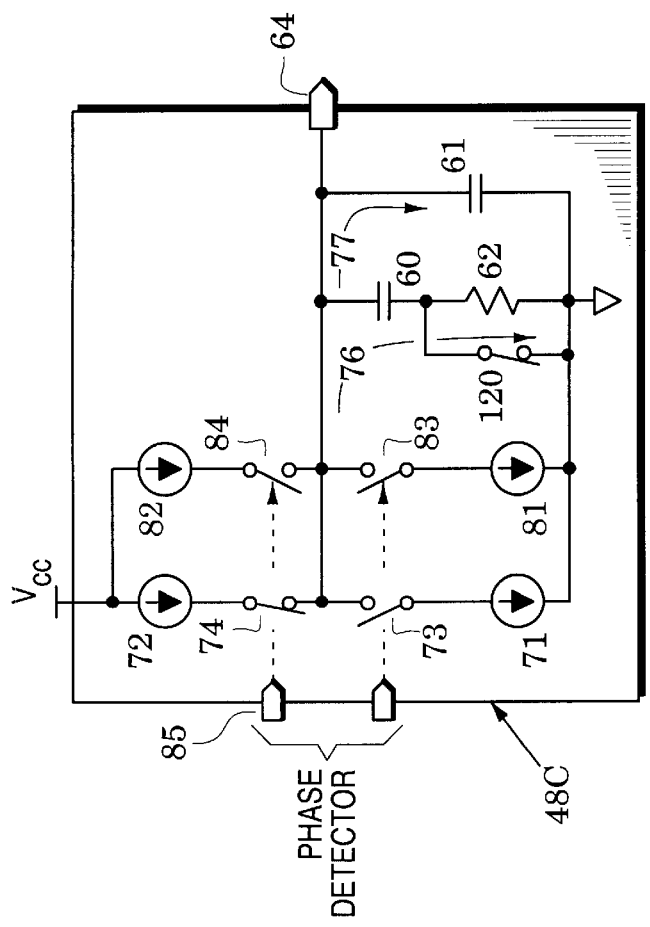

FIG. 6A illustrates another improved combined unit 48C which is similar to the unit 48A of FIG. 3A with like elements indicated by like reference numbers. In contrast, the positions of the compensation capacitor 60 and the compensation resistor 62 have been interchanged so that the compensation capacitor couples the compensation resistor to the VCO control port 64. In addition, a diversion switch 120 has been arranged to shunt the compensation resistor 62.

In response to the state control signal 47 of FIG. 1, the drive switch 74 and the diversion switch 120 are closed. Accordingly, drive currents 76 and 77 respectively charge the compensation and filter capacitors 60 and 62 and drive current 76 is diverted through the diversion switch 120. Drive current 76 does not flow through the compensation resistor and, therefore, no voltage is generated across it.

FIG. 6B shows the combined unit 48C after the frequency of the feedback signal (35 in FIG. 1) has reached the acquisition region shown in FIG. 2. The drive switches 73 and 74 and the diversion switch 120 are now opened by the state control signal 47 of FIG. 1. The feedback switches 83 and 84 are enabled by the state control signal 45 of FIG. 1 and in response to the phase detector (24 in FIG. 1), the feedback switches are alternately opened and closed (indicated by broken-line positions) to charge and discharge the compensation and filter capacitors 60 and 61 with feedback currents 86 that keep the VCO (30 in FIG. 1) locked to the reference signal (23 in FIG. 1).

Although the combined unit 48C requires an additional diversion switch (relative to the combined unit 48A of FIGS. 3A–3B), it eliminates the reduced step 112 of FIG. 4B and the corresponding reduced recharge time 116 because no voltage was generated across the compensation resistor 62 in the state of FIG. 6A. Accordingly, output-signal switching times of the invention are further enhanced.

Figure 7:
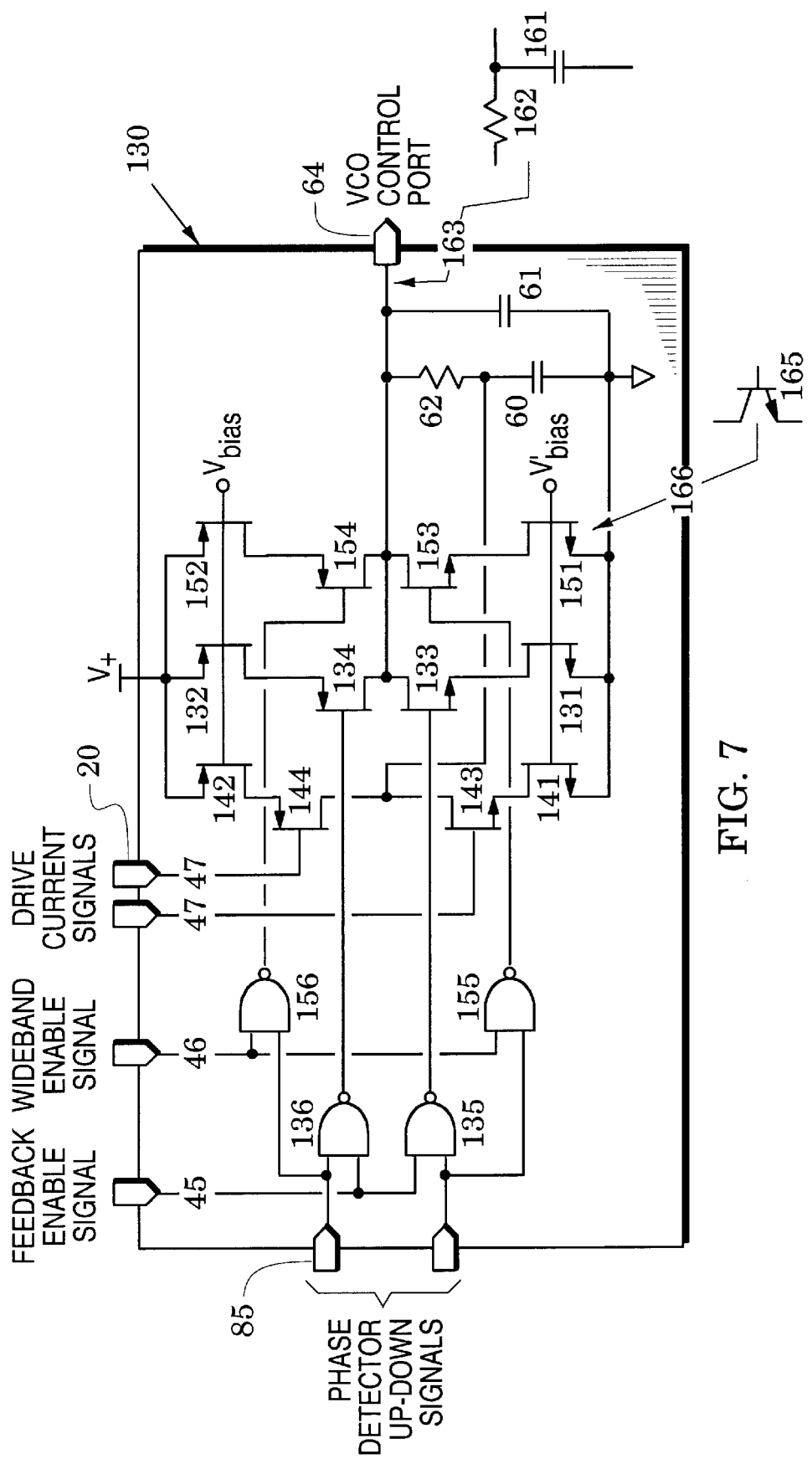
FIG. 7 is a schematic that illustrates a detailed embodiment of the combined charge pump and loop filter embodiment.

Detailed embodiments of the invention can be realized with various conventional structures. FIG. 7, for example, illustrates a combined charge pump and loop filter embodiment 130. This embodiment includes the loop compensation arrangement of compensation and filter capacitors 60 and 61 and compensation resistor 62 of the combined unit 48B of FIGS. 5A–5B.

The feedback current sources 81 and 82 of that unit are realized in FIG. 7 with transistors 131 and 132 that are biased with fixed biases Vbias and Vbias. The feedback switches 83 and 84 of FIGS. 5A–5B are realized with transistors 133 and 134 whose drains are coupled to the VCO control port 64 and whose gates are coupled through NAND gates 135 and 136 which gate phase detector up-down signals (from phase detector 24 of FIG. 1) under control of a feedback enable signal (i.e., the state control signal 45 of FIG. 1). In response to the feedback enable signal, therefore, the gates 135 and 136 cycle the feedback control loop 25 of FIG. 1 between its closed-loop and open-loop operational modes.

The drive current sources 71 and 72 of FIGS. 5A–5B are realized in FIG. 7 with transistors 141 and 142 that are also biased with the fixed biases $V_{bias}$ and $V'_{bias}$. The drive switches 73 and 74 are realized with transistors 143 and 144 whose drains are coupled to the junction between the compensation capacitor 60 and the compensation resistor 62 and whose gates receive drive current signals (i.e., the state control signal 47 of FIG. 1). In response to the drive current signals, therefore, the drive switch 144 of FIG. 7 provides the drive currents 100 and 101 of FIG. 5A (if activated, the drive switch 143 would reverse these drive currents).

As described above, the fast-lock processor (40 in FIG. 1) preferably modifies the charge pump (26 in FIG. 1) via a state control signal (46 in FIG. 1) to temporarily increase its transfer function after the control loop (25 in FIG. 1) is placed back in its closed-loop state (upon reaching the acquisition region of FIG. 2). In particular, the charge pump is modified to increase its output currents (i.e., increase the gain of its transfer function) in response to a wideband enable signal shown in FIG. 7 (i.e., the state control signal 46). The loop bandwidth is thus temporarily greater than its steady-state operational bandwidth which reduces the time for the control loop to pull the VCO (30 in FIG. 1) into final phase lock as indicated by the frequency path 53 in FIG. 2.

The increased wide-band current is provided in the embodiment 130 of FIG. 7 by wide-band transistors 153 and 154 which respectively gate currents from wide-band current sources 151 and 152 (which are biased with the fixed biases $V_{bias}$ and $V'_{bias}$). The drains of the wide-band transistors 153 and 154 are coupled to the VCO control port 64 and their gates are coupled through NAND gates 155 and 156 which gate phase detector up-down signals (from phase detector 24 of FIG. 1) under control of a wide-band enable signal (i.e., the state control signal 46 of FIG. 1).

The transfer-function gain can be modified by adjusting the wide-band currents delivered through the wide-band transistors 153 and 154. This current adjustment can be realized with various conventional structural variations (e.g., by adding additional transistor combinations 151, 152, 153 and 154 or by scaling the current source transistors 151 and 152.

The teachings of the invention can be applied to various control loop compensation structures. The compensation and filter capacitors 60 and 61 and compensation resistor 62 of FIG. 7 are generally referred to as a second order loop filter. This can be modified, for example, to a third order loop filter by inserting a filter resistor 162 and a second filter capacitor 161 between the filter capacitor 61 and the VCO control port 64 as indicated by insertion arrow 163. The inserted filter elements add a higher frequency pole to the loop transfer function to provide additional attenuation of loop spurious signals (e.g., the reference signal 23 of FIG. 1).

The teachings of the invention can be realized with various transistor structures. Complementary metal-oxide (CMOS) transistors are shown in FIG. 7, for example, but they may be equivalently replaced with bipolar junction transistors as exemplarized by transistor 165 and replacement arrow 166. It may be desirable to replace some of the single-ended switches (e.g., transistor 134) with differential pair switches to thereby realize cleaner switching and reduce generation of spurious switching signals.

In realizing embodiments of the invention, control portions (e.g., the controller 39 and the fast-lock processor 40 of FIG. 1) of the feedback systems can be realized with hardware elements (e.g., gate systems) and/or with programmable data processors.

Although some structures of the invention have been exemplarily shown to reside in charge pumps (e.g., gates 135 and 136 of FIG. 7), other embodiments can position them elsewhere in the feedback control loops (e.g., in the phase detector 24 of FIG. 1).

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A feedback control system that is responsive to a reference signal which has a destination frequency, comprising:
   a voltage-controlled oscillator (VCO) that provides an output signal whose output frequency is responsive to a VCO control signal at a VCO control port; and
   a feedback control loop that generates a feedback signal with a feedback frequency which corresponds to said output frequency and that provides said VCO control signal;

wherein said control loop includes:
  a) a phase detector that provides an error signal that corresponds to the phase difference between said reference signal and said feedback signal;
  b) a loop filter that is coupled to said VCO control port;
  c) a processor that responds to said reference signal and said feedback signal and provides a control signal which indicates when said feedback signal is within a predetermined acquisition range from said destination frequency;
  d) drive switches that, in absence of said control signal, couple an open-loop drive current to said loop filter to drive said feedback signal within said acquisition range and that, in presence of said control signal, terminate said drive current; and
  e) feedback switches that, in absence of said control signal, are decoupled from said error signal and that, in presence of said control signal, respond to said error signal and couple feedback currents to said loop filter to lock said feedback signal to said destination signal.

2. The system of claim 1, wherein said control loop further includes:
  drive current sources that provide said drive current in response to said drive switches; and
  feedback current sources that provide said feedback currents in response to said feedback switches.

3. The system of claim 1, further including a phase-lock detector that responds to said error signal and provides a monitor signal which indicates when said feedback signal is locked to said reference signal and wherein said processor couples said drive current to said loop filter and decouples said feedback switches from said error signal in response to absence of said monitor signal.

4. The system of claim 2, wherein:
  said drive current sources are transistors that supply said drive current in response to respective voltage biases;
  said feedback current sources are transistors that supply said feedback current in response to respective voltage biases;
  said drive switches are transistors that respond to said processor; and
  said feedback switches are transistors that respond to said phase detector.

5. The system of claim 3, wherein said control loop further includes boost switches that couple boost currents to said loop filter in response to said control signal and decouple said boost currents from said loop filter in response to said monitor signal.

6. The system of claim 1, wherein said control loop further includes a feedback network that couples said VCO and said phase detector and that generates said feedback signal in response to said output signal.

7. The system of claim 1, wherein said loop filter includes:
  a compensation capacitor;
  a compensation resistor in series with said compensation capacitor; and
  a filter capacitor in parallel with said compensation capacitor and said compensation resistor.

8. A feedback control system that is responsive to a reference signal which has a destination frequency, comprising:
  a voltage-controlled oscillator (VCO) that provides an output signal whose output frequency is responsive to a VCO control signal at a VCO control port; and
  a feedback control loop that generates a feedback signal with a feedback frequency which corresponds to said output frequency and that provides said VCO control signal;

wherein said control loop includes:
  a) a compensation resistor;
  b) a compensation capacitor that couples said compensation resistor to said VCO control port and has a first capacitance;
  c) a filter capacitor that is coupled to said VCO control port and has a second capacitance which is less than said first capacitance;
  d) open-loop switches that couple a drive current to said compensation and filter capacitors to drive said feedback frequency within a predetermined acquisition range of said destination frequency;
  e) a diversion switch that diverts said drive current from said compensation resistor; and
  f) closed-loop switches that couple feedback currents to said compensation and filter capacitors to lock said feedback frequency to said destination frequency.

9. The system of claim 8, wherein said control loop further includes:
  drive current sources that provide said drive current in response to said open-loop switches; and
  feedback current sources that provide said feedback currents in response to said closed-loop switches;
  and wherein said feedback control loop further includes a phase detector that controls said closed-loop switches in response to said reference signal and said feedback signal.

10. The system of claim 9, further including a processor that opens said open-loop switches and said diversion switch when said feedback frequency is within said acquisition range.

11. The system of claim 10, wherein:
  said drive current sources are transistors that supply said drive current in response to respective voltage biases;
  said feedback current sources are transistors that supply said drive current in response to respective voltage biases;
  said open-loop switches and said diversion switch are transistors that respond to said processor; and
  said closed-loop switches are transistors that respond to said phase detector.

12. The system of claim 8, wherein said control loop further includes:
  a phase detector; and
  a feedback network that couples said VCO and said phase detector and that generates said feedback signal in response to said output signal.

13. The system of claim 8, wherein said control loop further includes:
  a phase detector;
  a feedback network that couples said VCO and said phase detector and that generates said feedback signal in response to said output signal;
  a charge pump coupled to said phase detector; and
  a loop filter which is coupled between said charge pump and said VCO to provide said VCO control signal.

14. The system of claim 8, wherein said control loop has a charge pump and a loop filter which is coupled between said charge pump and said VCO to provide said VCO control signal and wherein:
  said charge pump includes said open-loop, closed-loop and diversion switches; and
  said loop filter includes said compensation and filter capacitors and said compensation resistor.

* * * * *